US012646555B2

(12) United States Patent
Wei et al.

(10) Patent No.: US 12,646,555 B2
(45) Date of Patent: Jun. 2, 2026

(54) MEMORY AND OPERATING METHOD THEREOF, MEMORY SYSTEM AND ELECTRONIC DEVICE

(71) Applicant: Yangtze Memory Technologies Co., Ltd., Wuhan (CN)

(72) Inventors: Debo Wei, Wuhan (CN); Huangpeng Zhang, Wuhan (CN); Xiaodong Mei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 253 days.

(21) Appl. No.: 18/516,802

(22) Filed: Nov. 21, 2023

(65) Prior Publication Data

US 2025/0078900 A1     Mar. 6, 2025

(30) Foreign Application Priority Data

Aug. 29, 2023     (CN) ........................... 202311114181.6

(51) Int. Cl.
*G11C 11/406*          (2006.01)
*G11C 11/408*          (2006.01)
(52) U.S. Cl.
CPC .. *G11C 11/40626* (2013.01); *G11C 11/40615* (2013.01); *G11C 11/4087* (2013.01)
(58) Field of Classification Search
CPC .................... G11C 11/40626; G11C 11/40615
USPC ....................................................... 365/222
See application file for complete search history.

(56) References Cited

U.S. PATENT DOCUMENTS

| | | | |
|---|---|---|---|
| 5,784,328 A | 7/1998 | Irrinki et al. | |
| 2018/0197599 A1* | 7/2018 | Choi | G11C 11/40611 |
| 2019/0139596 A1 | 5/2019 | Jang et al. | |
| 2019/0371391 A1 | 12/2019 | Cha et al. | |
| 2020/0402569 A1* | 12/2020 | He | G11C 11/40626 |

FOREIGN PATENT DOCUMENTS

| | | |
|---|---|---|
| CN | 103426468 A | 12/2013 |
| CN | 103677966 A | 3/2014 |

OTHER PUBLICATIONS

Office Action in Chinese Appln. No. 202311114181.6, mailed on Aug. 27, 2025, 18 pages (with English translation).

* cited by examiner

*Primary Examiner* — Anthan Tran
(74) *Attorney, Agent, or Firm* — Fish & Richardson P.C.

(57)     ABSTRACT

Implementations of the present disclosure disclose a memory and an operating method thereof, a memory system, and an electronic device. The memory includes a memory cell array and a peripheral circuit coupled with the memory cell array. The peripheral circuit includes: a temperature sensing circuit configured to sense a temperature of the memory and generate a temperature signal based on the sensed temperature; a control logic circuit configured to determine a target refresh period based on the temperature signal and a mapping table, wherein the mapping table includes a plurality of preset temperature signals and a plurality of preset refresh periods in a one-to-one correspondence; and a refresh control circuit configured to adjust a refresh period of a refresh signal to the target refresh period, wherein the refresh signal is configured to indicate performing a refresh operation on the memory cell array.

20 Claims, 16 Drawing Sheets

100

300

300

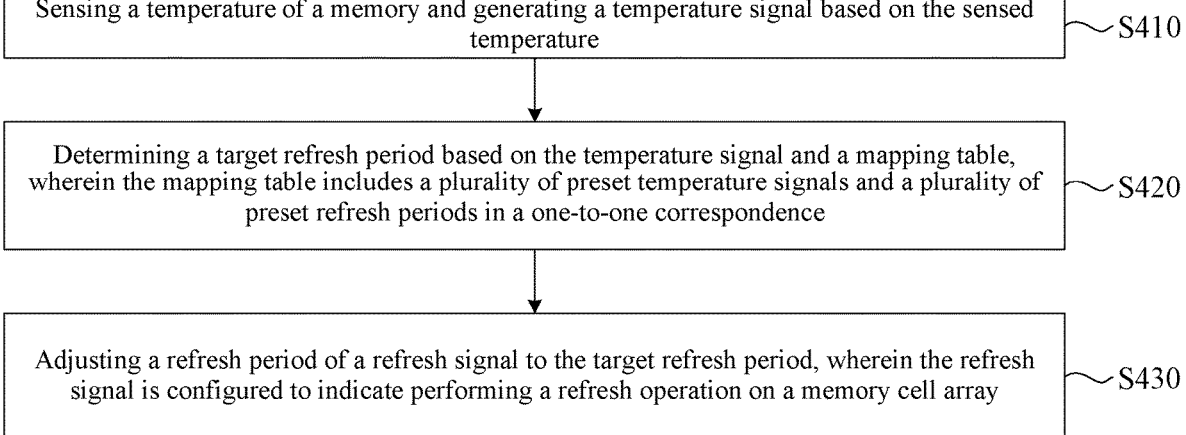

| Sensing a temperature of a memory and generating a temperature signal based on the sensed temperature | ∼S410 |

Determining a target refresh period based on the temperature signal and a mapping table, wherein the mapping table includes a plurality of preset temperature signals and a plurality of preset refresh periods in a one-to-one correspondence ∼S420

Adjusting a refresh period of a refresh signal to the target refresh period, wherein the refresh signal is configured to indicate performing a refresh operation on a memory cell array ∼S430

Fig. 11

MEMORY AND OPERATING METHOD THEREOF, MEMORY SYSTEM AND ELECTRONIC DEVICE

CROSS-REFERENCE TO RELATED APPLICATIONS

This application claims priority to Chinese Patent Application No. 202311114181.6, filed on Aug. 29, 2023, which is hereby incorporated by reference in its entirety.

TECHNICAL FIELD

Implementations of the present disclosure relate to semiconductor technology, particularly to but not limited to a memory and an operating method thereof, as well as a memory system and an electronic device.

BACKGROUND

Semiconductor memories are classified into a volatile memory and a nonvolatile memory depending on whether stored data therein is remained upon power loss, wherein the volatile memory that loses data upon power loss includes a static random access memory (SRAM) and a dynamic random access memory (DRAM).

The volatile memory remains data stored in memory cells by refreshing periodically. As temperature increases, data retaining characteristic of memory cells becomes worse. Therefore, it is necessary to refresh with a shorter period, namely refreshing more frequently, to guarantee the reliability of data. However, refreshing frequently will result in a higher power consumption.

SUMMARY

In view of this, implementations of the present disclosure provide a memory and an operating method thereof, a memory system and an electronic device.

In a first aspect, an implementation of the present disclosure provides a memory comprising a memory cell array and a peripheral circuit coupled with the memory cell array, wherein the peripheral circuit comprises: a temperature sensing circuit configured to sense a temperature of the memory and generate a temperature signal based on the sensed temperature; a control logic circuit configured to determine a target refresh period based on the temperature signal and a mapping table, wherein the mapping table comprises a plurality of preset temperature signals and a plurality of preset refresh periods in a one-to-one correspondence; and a refresh control circuit configured to adjust a refresh period of a refresh signal to the target refresh period, wherein the refresh signal is configured to indicate performing a refresh operation on the memory cell array.

In a second aspect, an implementation of the present disclosure provides an operating method of a memory comprising a memory cell array and a peripheral circuit coupled with the memory cell array, wherein the operating method comprises: sensing a temperature of the memory and generating a temperature signal based on the sensed temperature; determining a target refresh period based on the temperature signal and a mapping table, wherein the mapping table comprises a plurality of preset temperature signals and a plurality of preset refresh periods in a one-to-one correspondence; and adjusting a refresh period of a refresh signal to the target refresh period, wherein the refresh signal is configured to indicate performing a refresh operation on the memory cell array.

In a third aspect, an implementation of the present disclosure further provides a memory system comprising: one or more memories as described in any one of the above-described implementations; and a memory controller coupled to the memories and configured to control the memories.

In a fourth aspect, an implementation of the present disclosure further provides an electronic device comprising the memory system as described in the above-described implementation.

In implementations of the present disclosure, the temperature sensing circuit senses the temperature of the memory and generates a temperature signal based on the sensed temperature, the control logic circuit determines a target refresh period based on the temperature signal and a mapping table, and the refresh control circuit adjusts the refresh period of the refresh signal to the target refresh period. Thus, in the first aspect, it is possible to adjust the refresh period based on a temperature change to avoid data loss and guarantee the reliability of data. In the second aspect, it is possible to adjust the refresh period flexibly based on a temperature change to avoid frequent refresh operations, thereby reducing power consumption and increasing useful life of the memory. In the third aspect, it is possible to self-define different mapping tables for different memories without changing circuit design, thereby improving the flexibility of adjusting the refresh period.

BRIEF DESCRIPTION OF DRAWINGS

FIG. 11 is a flow diagram of an operating method of a memory illustrated according to an implementation of the present disclosure;

DETAILED DESCRIPTION

Figure 1:
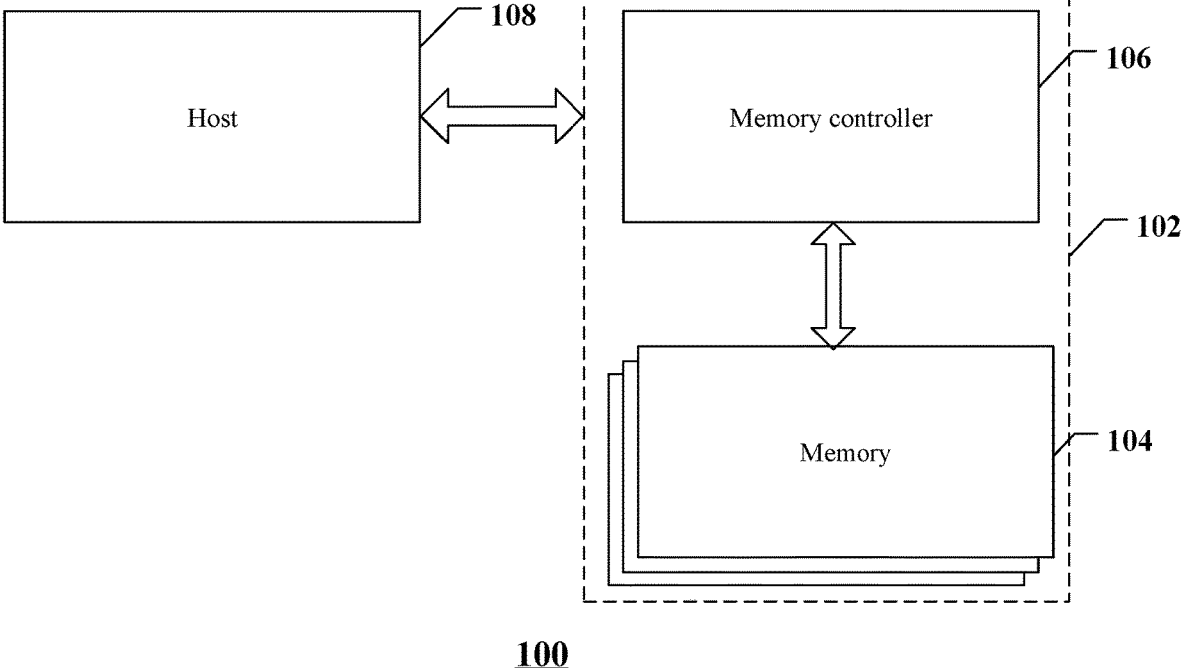
FIG. 1 is a schematic diagram of a system illustrated according to an implementation of the present disclosure.

To facilitate understanding the present disclosure, example implementations of the present disclosure will be described in greater detail below with reference to the related accompanying drawings. Although example implementations of the present disclosure are shown in the drawings, it is to be appreciated that the present disclosure may be implemented in various forms rather than being limited to the specific implementations as set forth herein. In contrast, these implementations are provided to understand the present disclosure more thoroughly and convey the scope of the present disclosure completely to those skilled in the art.

In the following description, a large amount of specific details are set forth to provide thorough understanding of the present disclosure. However, it is obvious to those skilled in the art that the present disclosure may be implemented without one or more of these details. In some implementations, in order to avoid obscuring the present disclosure, some technical features well known in the art are not described. That is, not all features of the practical implementations are described herein, and well known functions and structures are not described.

Generally, terms should be understood at least in part from the usage in their contexts. For example, the term "one or more" as used herein, depending at least in part upon context, may be used to describe any feature, structure, or characteristic in a singular sense or may be used to describe combinations of features, structures or characteristics in a plural sense. Similarly, terms, such as "a", "an", or "the" again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Unless otherwise defined, terms as used herein may only for describe specific implementations rather than limiting the present disclosure. As used herein, the singular form "a", "an" and "the" are also intended to include the plural form unless otherwise stated in the context. It is also understood that while used in the description, terms such as "consist", "comprise" and/or "include" indicate the presence of the stated features, integers, steps, operations, elements and/or components, but do not exclude the presence or addition of one or more other features, integers, steps, operations, elements and/or components, as well as the combination thereof. As used herein, the term "and/or" includes any and all combinations of relevant listed items.

In order to understand the present disclosure thoroughly, detailed steps and detailed structures will be presented in the following description to set forth the technical solutions of the present disclosure. Example implementations of the present disclosure are described in detail hereinbelow. However, the present disclosure may have other implementations other than these detailed described implementations.

FIG. 1 is a schematic diagram of system 100 illustrated according to an implementation of the present disclosure. The system 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having a storage device therein.

As shown in FIG. 1, system 100 may include a host 108 and a memory system 102 having one or more memories 104 and a memory controller 106. The host 108 may be a processor of the electronic device, such as a central processing unit (CPU), or a system-on-chip (SoC), such as an application processor (AP). The host 108 may be configured to send data to the memory 104 or receive data from the memory 104.

The memory controller 106 is coupled to the memory 104 and the host 108, and is configured to control the memory 104. The memory controller 106 can manage the data stored in the memory 104 and communicate with the host 108. In some implementations, the memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, the memory controller 106 is designed for operating in a high duty-cycle environment like solid state disks (SSDs) or embedded multimedia cards (eMMCs) that are used as e.g., data storage of the mobile devices such as smart phones, tablet computers and laptop computers, and enterprise memory arrays.

The memory controller 106 can be configured to control operations of the memory 104, such as read, erase, and write operations. The memory controller 106 can also be configured to manage various functions with respect to the data stored or to be stored in the memory 104 including, but not limited to bad-block management, garbage collection, logical-to-physical address conversion, wear leveling, etc. In some implementations, the memory controller 106 is further configured to process error correction codes (ECCs) with respect to the data read from or written to the memory 104. Any other suitable functions may be performed by the memory controller 106 as well, for example, formatting the memory 104. The memory controller 106 can communicate with a host (e.g., the host 108) according to a particular communication protocol. For example, the memory controller 106 may communicate with the host through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced system device interface (ESDI) protocol, an integrated drive electronics (IDE) protocol, a Firewire protocol, etc.

Figure 2A:
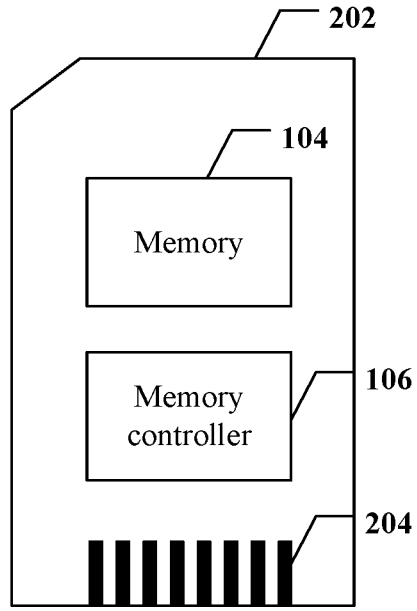
FIG. 2a is a schematic diagram of a memory card illustrated according to an implementation of the present disclosure.
Figure 2B:
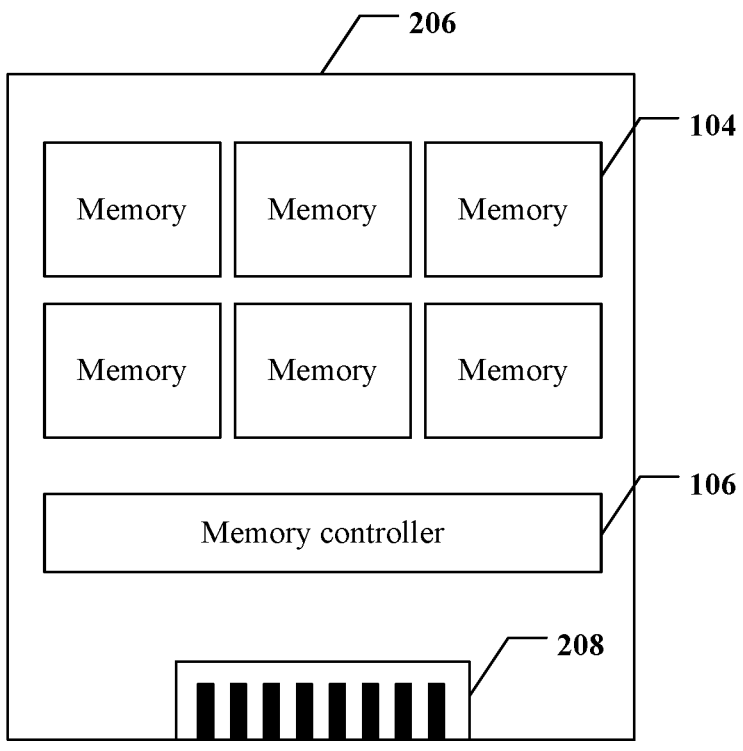
FIG. 2b is a schematic diagram of a solid state disk illustrated according to an implementation of the present disclosure.

Memory controller 106 and one or more memories 104 can be integrated into various types of storage devices, for example, be included in the same package, such as a universal Flash storage package or an eMMC package. That is, the memory system 102 can be implemented and packaged into different types of end electronic products. In one example as shown in FIG. 2*a*, the memory controller 106 and a single memory 104 can be integrated into a memory card 202. The memory card 202 may include a PC card (Personal Computer Memory Card International Association, PCMCIA), a CF card, a smart media (SM) card, a memory stick, a multi-media card (MMC), a reduced-size MMC (RS-MMC), a multi-media card micro (MMCmicro), a SD card (SD, miniSD, microSD, SDHC), a universal flash storage (UFS), etc. The memory card 202 may also include a memory card connector 204 coupling the memory card 202 with the host (e.g., the host 108 in FIG. 1). In another example as shown in FIG. 2b, the memory controller 106 and multiple memories 104 can be integrated into an SSD 206. The SSD 206 may also include a SSD connector 208 coupling the SSD 206 with the host (e.g., the host 108 in FIG. 1). In some implementations, the storage capacity and/or the operation speed of the SSD 206 is greater than those of the memory card 202. The memory 104 may include a volatile memory and a nonvolatile memory such as a NAND flash memory, a dynamic random access memory, a ferroelectric random access memory, a magnetic random access memory, a phase-change random access memory, a resistance-change random access memory, a nano random access memory, etc.

Figure 3:
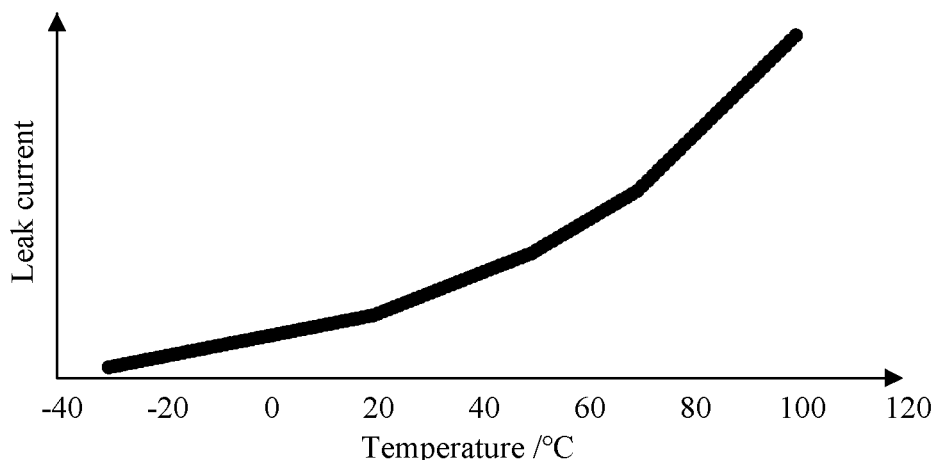
FIG. 3 is a schematic diagram of a leak current vs. a temperature illustrated according to an implementation of the present disclosure.
Figure 4:
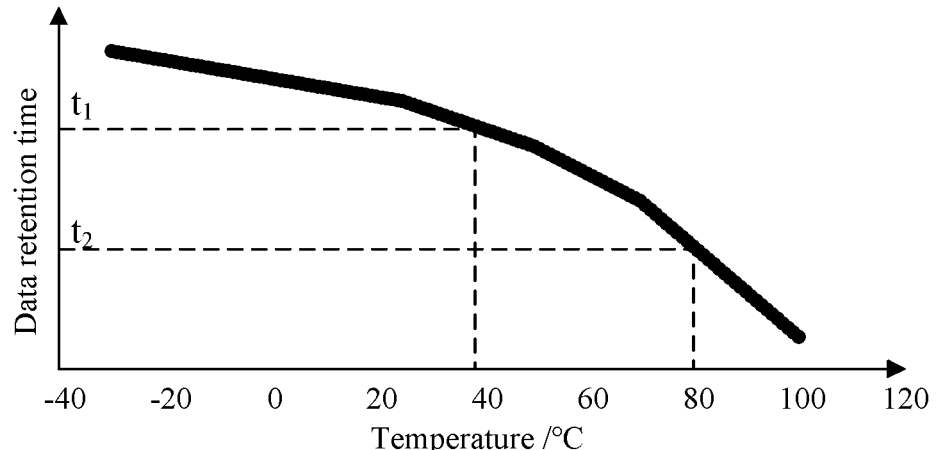
FIG. 4 is a schematic diagram of data retention time vs. a temperature illustrated according to an implementation of the present disclosure.

A leak current of memory cells in the volatile memory is directly proportional to temperature. That is, the leak current increases with temperature as shown in FIG. 3. Since a charge stored in the memory cell is limited, data retention time of the memory cell is inversely proportional to the temperature. For example, the data retention time at 40° C. is $t_1$, and the data retention time at 80° C. is $t_2$, wherein $t_2$ is smaller than $t_1$, as shown in FIG. 4. In order to guarantee the reliability of data, the volatile memory needs to be periodically refreshed to retain data stored in the memory cells.

There are two ways for a periodic refresh operation. One is issuing periodic refresh commands by the memory controller that is responsible for data retention. The other is generating refresh signals inside the memory, also known as a self-refresh. The self-refresh is a method for retaining data without external refresh commands. A timer is provided inside the memory that may trigger the periodic refresh operation. The user issues a self-refresh entering command to enter the self-refresh mode, and the memory performs refresh operation internally until a self-refresh exiting command is issued.

The self-refresh operation often uses a fixed refresh period. In order to ensure that data is kept intact during a high temperature, the fixed refresh period should be short enough. For example, in order to ensure that the memory operates normally at a temperature lower than 80° C., the refresh period should be smaller than $t_2$, which would result in too frequent self-refresh operations at the temperature lower than 80° C., causing extra power consumption without any benefits and also decreasing the useful life of the memory at the same time.

Figure 5:
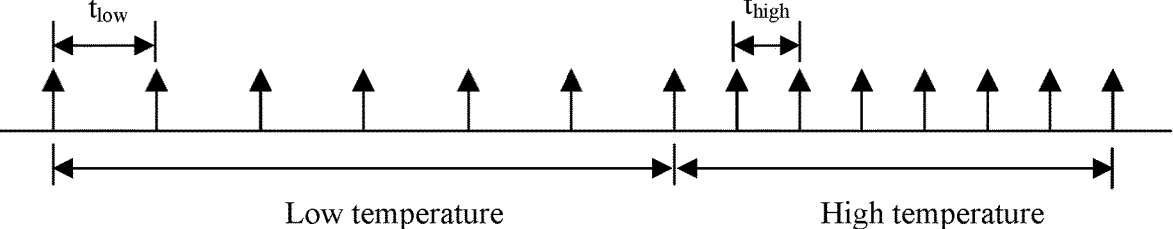
FIG. 5 shows refresh periods at different temperatures according to an implementation of the present disclosure.
Figure 6:
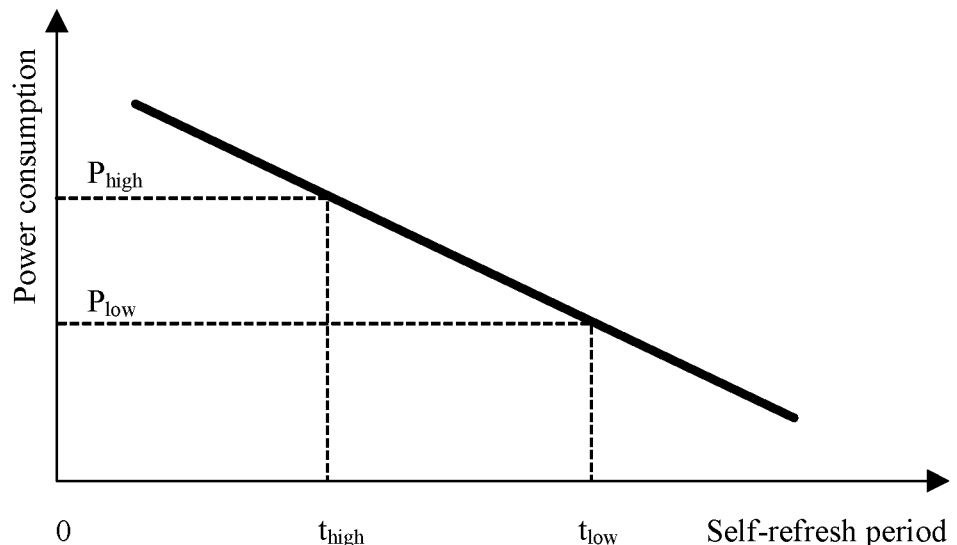
FIG. 6 is a schematic diagram of a power consumption vs. a self-refresh period illustrated according to an implementation of the present disclosure.

It is to be noted that since the leak current increases with temperature, it is required that the refresh period for the self-refresh operation becomes shorter as the temperature becomes higher. For example, the refresh period is $t_{low}$ at a low temperature, and is thigh at a high temperature, wherein thigh is smaller than $t_{low}$, as shown in FIG. 5. However, a shorter refresh period implies a higher refresh frequency, which would cause a higher power consumption. For example, when the refresh period is $t_{low}$, the power consumption is $P_{low}$, and when the refresh period is thigh, the power consumption is $P_{high}$, wherein $P_{high}$ is greater than $P_{low}$, as shown in FIG. 6.

Based on this, in order to address one or more of the above-described technical problems, an implementation of the present disclosure provides a memory.

Figure 7A:
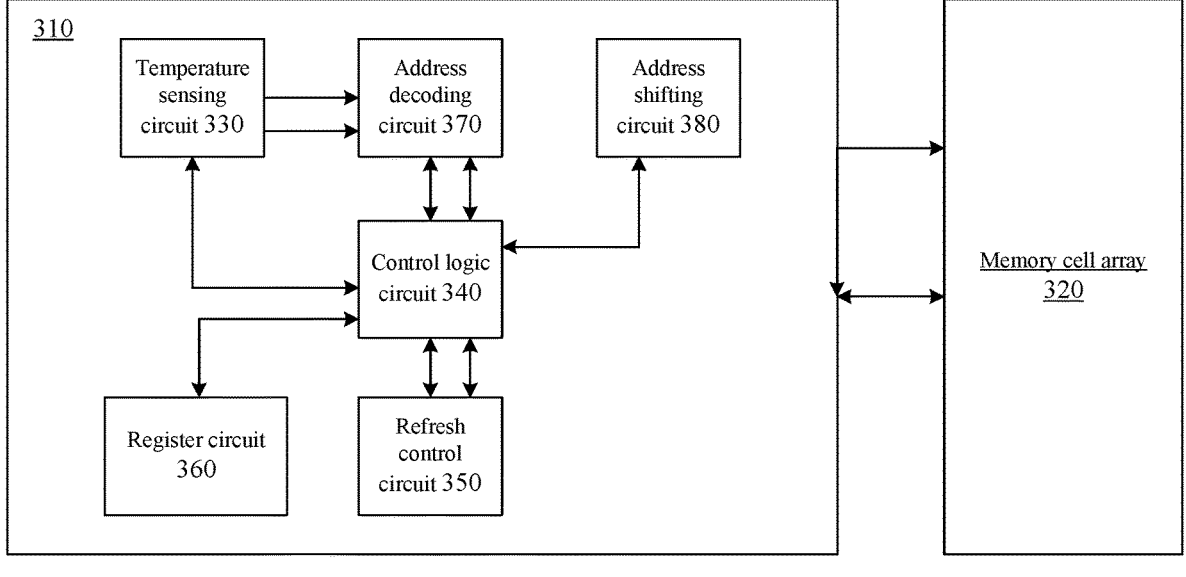
FIGS. 7a and 7b are schematic diagrams of a memory illustrated according to an implementation of the present disclosure.
Figure 7B:
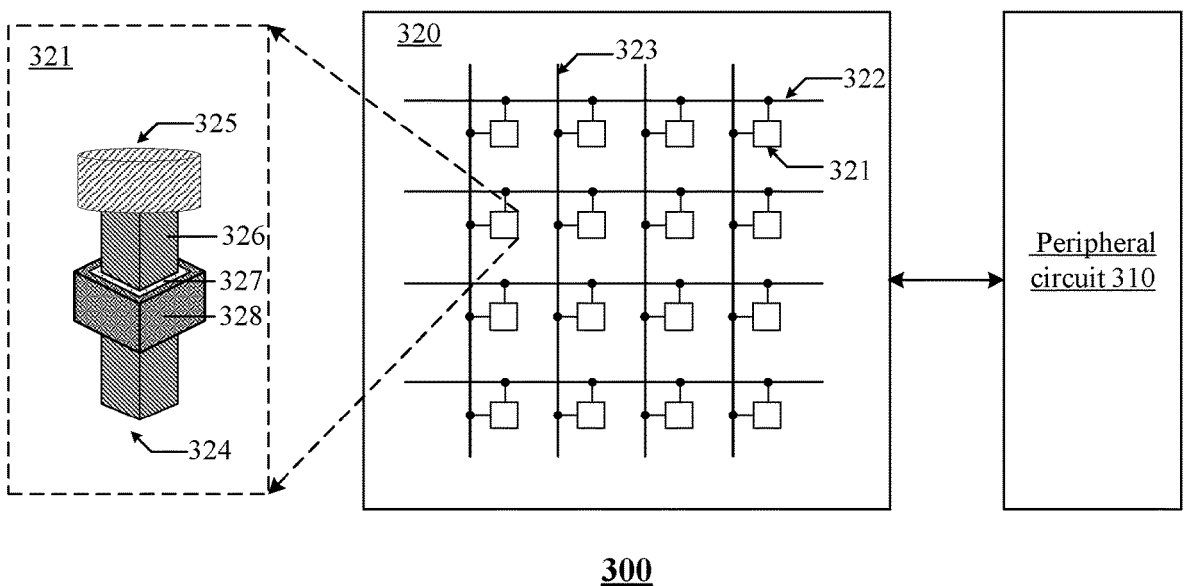

FIGS. 7a and 7b are schematic diagrams of a memory 300 illustrated according to an implementation of the present disclosure. Referring to FIGS. 7a and 7b, the memory 300 includes a memory cell array 320 and a peripheral circuit 310 coupled with the memory cell array 320. The peripheral circuit 310 includes: a temperature sensing circuit 330 configured to sense the temperature of the memory 300 and generate a temperature signal based on the sensed temperature; a control logic circuit 340 configured to determine a target refresh period based on the temperature signal and a mapping table, wherein the mapping table includes a plurality of preset temperature signals and a plurality of preset refresh periods in a one-to-one correspondence; and a refresh control circuit 350 configured to adjust the refresh period of the refresh signal to the target refresh period, wherein the refresh signal is configured to indicate performing a refresh operation on the memory cell array 320.

In implementations of the present disclosure, the memory 300 includes, but not limited to a DRAM, a double data rate (DDR) synchronous dynamic random access memory, a low power double data rate (LPDDR) dynamic random access memory, a graphics double data rate (GDDR) dynamic random access memory, and a high bandwidth memory (HBM), etc.

Referring to FIG. 7b, the memory 300 includes a plurality of word lines 322 and a plurality of bit lines 323 through which the peripheral circuit 310 is coupled with the memory cell array 320. The memory cell array 320 includes a plurality of memory cells 321 arranged in an array, and a memory cell 321 includes a transistor 324 and an energy storage element 325 coupled with the transistor 324. The transistor 324 includes a semiconductor pillar 326, a gate dielectric layer 327 and a gate 328. The semiconductor pillar includes a source, a drain and a channel between the source and drain. The gate dielectric layer 327 covers a sidewall of the channel, and the gate 328 contacts at least one sidewall of the gate dielectric layer 327, wherein the word line 322 is coupled with the gates of the memory cells 321 in the same row, and the bit line 323 is coupled with (for example, the drains of) the semiconductor pillars of the memory cells 321 in the same column.

In an example implementation, the memory cell 321 may be a volatile memory cell, such as a DRAM memory cell, and the energy storage element 325 may be a capacitor. Of course, in other implementations, the memory cell 321 may be a phase change memory cell, and the energy storage element 325 may be a phase change storage layer. Alternatively, the memory cell 321 may be a ferroelectric memory cell, and the energy storage element 325 may be a ferroelectric storage layer. The memory cell is not limited in the present disclosure.

The temperature sensing circuit 330 may sense the temperature of the memory 300, and output a temperature signal based on the sensed temperature. In an example implementation, the temperature sensing circuit 330 includes a temperature sensor that may convert an analog temperature signal into a digital temperature signal and transmit the digital temperature signal to the control logic circuit 340. The temperature signal output by the temperature sensor may be a voltage signal corresponding to the sensed temperatures, and the number of the temperature sensors may be one or more. Although the temperature sensing circuit 330 is described as in the memory 300 in the present implementation, the temperature sensing circuit 330 may be outside the memory 300 and sense the temperature of the memory 300.

It is to be noted that the operating temperature range of the memory 300 may be divided into a plurality of temperature sections, and temperature signals corresponding to different temperatures may be the same or different. For example, if the first temperature and the second temperature belong to the same temperature section, then the temperature signals corresponding to the first and second temperatures may be the same. As another example, if the first temperature and the second temperature belong to different temperature sections, then the temperature signals corresponding to the first and second temperatures may be different.

Figure 8:
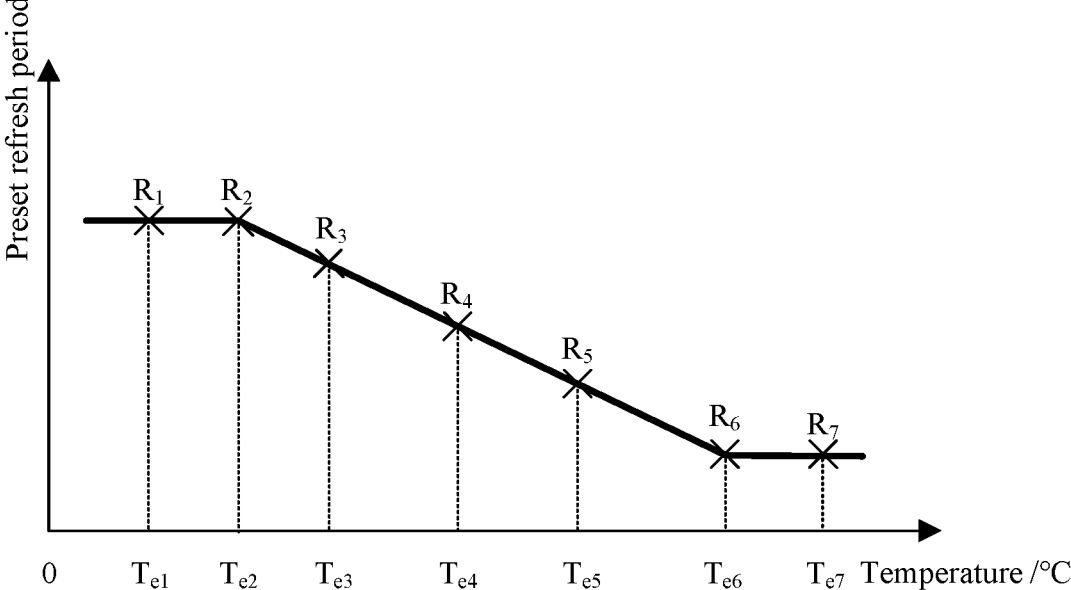
FIG. 8 is a schematic diagram of a refresh period vs. a temperature illustrated according to an implementation of the present disclosure.

Illustratively, referring to FIG. 8, 7 key temperatures are selected in the operating temperature range of the memory 300, e.g., key temperatures $T_{e1}$, $T_{e2}$, $T_{e3}$, $T_{e4}$, $T_{e5}$, $T_{e6}$ and $T_{e7}$. It is possible to divide 7 temperature sections corresponding to 7 preset temperature signals respectively, e.g. preset temperature signals $T_{code1}$, $T_{code2}$, $T_{code3}$, $T_{code4}$, $T_{code5}$, $T_{code6}$ and $T_{code7}$ in Table 1 below.

In an example, the operating temperature range of the memory 300 is $20° C. \leq T \leq 80° C.$, and the 7 key temperatures are 25° C., 35° C., 45° C., 50° C., 60° C., 70° C. and 80° C., respectively. When the temperature sensing circuit 330 senses the temperature of the memory 300 to be 40° C., which corresponds to the third temperature section, the temperature sensor outputs the temperature signal $T_{code3}$.

It is to be noted that the key temperatures and/or the number of key temperatures may be determined based on the leak current vs. temperature of the memory 300. For example, if the leak current of the memory 300 changes drastically under at least one temperature, then the temperature may be determined as a key temperature. As another example, if the leak current of the memory 300 changes sensitively with the temperature, then more key temperatures may be selected, and thus more temperature sections are divided to achieve more precise adjustment of the refresh period. The above-described values are only examples for conveying the present disclosure to those skilled in the art, and the key temperatures and/or the number of key temperatures are not limited thereto.

The control logic circuit 340 may receive the temperature signal, and determine the target refresh period based on the received temperature signal and the mapping table. Illustratively, referring to Table 1 below, the mapping table includes 7 preset temperature signals $T_{code1}$, $T_{code2}$, $T_{code3}$, $T_{code4}$, $T_{code5}$, $T_{code6}$ and $T_{code7}$ corresponding to 7 preset refresh periods $R_1$, $R_2$, $R_3$, $R_4$, $R_5$, $R_6$ and $R_7$ respectively. When the control logic circuit 340 receives temperature signal $T_{code3}$, the target refresh period is determined to be $R_3$, and the refresh control circuit 350 adjusts the refresh period of the refresh signal to the target refresh period $R_3$ and performs a refresh operation on the memory cell array 320 with the target refresh period $R_3$ as the refresh period.

TABLE 1

| | mapping table | |
| | | |
| Sub-mapping table | Preset temperature signal | Preset refresh period |
| sub-mapping table "1" | $T_{code1}$ | $R_1$ |
| sub-mapping table "2" | $T_{code2}$ | $R_2$ |
| sub-mapping table "3" | $T_{code3}$ | $R_3$ |
| sub-mapping table "4" | $T_{code4}$ | $R_4$ |
| sub-mapping table "5" | $T_{code5}$ | $R_5$ |

TABLE 1-continued

| | mapping table | |
| | | |
| Sub-mapping table | Preset temperature signal | Preset refresh period |
| sub-mapping table "6" | $T_{code6}$ | $R_6$ |
| sub-mapping table "7" | $T_{code7}$ | $R_7$ |

Illustratively, at the first timing, the temperature sensing circuit 330 senses the temperature of the memory 300 to be 75° C. and outputs a temperature signal $T_{code7}$, the control logic circuit 340 looks up the mapping table based on the temperature signal $T_{code7}$ to determine the target refresh period to be $R_7$, and the refresh control circuit 350 adjusts the refresh period of the refresh signal to the target refresh period $R_7$ to avoid data loss. At the second timing, the temperature sensing circuit 330 senses that the temperature of the memory 300 falls to 40° C. and outputs a temperature signal $T_{code3}$, the control logic circuit 340 looks up the mapping table based on the temperature signal $T_{code3}$ to determine the target refresh period to be $R_3$, and the refresh control circuit 350 adjusts the refresh period of the refresh signal to the target refresh period $R_3$. It is appreciated that after the temperature falls to 40° C., the leak current of the memory cells will decrease. It is sufficient to retain data by adjusting the refresh period to the target refresh period $R_3$, thereby avoiding frequent refresh. Thus, it is possible to avoid data loss by adjusting the refresh period based on a temperature change, which guarantees the reliability of data. At the same time, adjusting refresh period flexibly based on the temperature change avoids frequent refresh operations, thereby reducing power consumption.

In a practical application, it is possible to self-define different mapping tables for different memories, thereby improving the flexibility of adjusting the refresh period. For example, before the memories leave the factory, researchers may develop and design different mapping tables for different memories and write (program) the mapping tables into the memories.

In implementations of the present disclosure, the temperature sensing circuit senses a temperature of the memory and generates a temperature signal based on the sensed temperature, the control logic circuit determines the target refresh period based on the temperature signal and the mapping table, and the refresh control circuit adjusts the refresh period of the refresh signal to the target refresh period. Thus, in the first aspect, it is possible to adjust the refresh period based on a temperature change to avoid data loss and guarantee the reliability of data. In the second aspect, it is possible to adjust the refresh period flexibly based on a temperature change to avoid frequent refresh operations, thereby reducing power consumption and increasing useful life of the memory. In the third aspect, it is possible to self-define different mapping tables for different memories without changing circuit design, thereby improving the flexibility of adjusting the refresh period.

In some implementations, the peripheral circuit 310 further includes: a register circuit 360 configured to store a mapping table, wherein the mapping table includes a plurality of sub-mapping tables for recoding the correspondence relationship between preset temperature signals and preset refresh periods; an address decoding circuit 370 configured to generate a first target address by decoding the temperature signal, wherein the first target address is configured to indicate the physical address of the first sub-mapping table of the plurality of sub-mapping tables; and the control logic circuit 340 is configured to acquire the first sub-mapping table based on the first target address to determine the target refresh period.

In implementations of the present disclosure, the mapping table may be stored in the register circuit 360, and the mapping table includes a plurality of sub-mapping tables, and different sub-mapping tables record the correspondence relationship between different preset temperature signals and preset refresh periods. For example, referring to Table 1 above, the mapping table includes 7 sub-mapping tables. The sub-mapping table "1" records the mapping relationship between the preset temperature signal $T_{code1}$ and the preset refresh period $R_1$; the sub-mapping table "2" records the mapping relationship between the preset temperature signal $T_{code2}$ and the preset refresh period $R_2$; . . . ; and the sub-mapping table "7" records the mapping relationship between the preset temperature signal $T_{code7}$ and the preset refresh period $R_7$. The number of the sub-mapping tables in the mapping table is not limited to 7, and may be smaller than or greater than 7.

Illustratively, the address decoding circuit 370 receives a temperature signal $T_{code3}$, generates a first target address by decoding the temperature signal, and transmits the first target address to the control logic circuit 340. The control logic circuit 340 reads the sub-mapping table "3" in the register circuit 360 based on the first target address to determines the target refresh period $R_3$. It is appreciated that the plurality of sub-mapping tables are stored at different locations in the register circuit 360, and correspond to a plurality of different physical addresses. The first sub-mapping table is one of the plurality of sub-mapping tables, and the first target address is the physical address corresponding to the sub-mapping table. In the present example, the first sub-mapping table is the sub-mapping table "3" and the first target address is the physical address of the sub-mapping table "3".

The register circuit 360 includes, but not limited to a mode register. The mode register may store various operating parameters, control parameters, and so on for operating the memory 300, and may be programmed to set the plurality of operating parameters and control parameters, and may store parameter codes. For example, the mode register may store parameter codes of the plurality of refresh periods related to the temperature signals (namely mapping table), and may be read to determine the target refresh period. In an example implementation, the mode register may store data temporarily or permanently.

In some implementations, the memory cell array 320 includes a first memory cell and a second memory cell, wherein the second memory cell has a data retention time smaller than that of the first memory cell. The control logic circuit 340 may be, for example, configured to: acquire the first sub-mapping table based on the first target address to determine the first target refresh period for the first memory cell; acquire the second sub-mapping table of the plurality of sub-mapping tables based on the shifted first target address to determine the second target refresh period for the second memory cell, wherein the second sub-mapping table is different from the first sub-mapping table, and the second target refresh period is smaller than the first target refresh period.

The memory cell array 320 includes a plurality of memory cells 321. Any two memory cells 321 may have same or different data retention characteristics under the same temperature depending on the characteristics of the memory cells 321. For example, the memory cell array 320 includes a first memory cell and a second memory cell, wherein the second memory cell has a data retention time smaller than that of the first memory cell under the same temperature. That is, the second memory cell has a poorer data retention characteristic. In order to avoid data loss, different refresh periods may be set for memory cells with different data retention characteristics, which will be illustrated with reference to Table 1 above and FIGS. 8 and 9.

Illustratively, as shown in Table 1 above and FIG. 8, when the temperature sensing circuit 330 senses that the temperature of the memory 300 is 40° C., it outputs a temperature signal $T_{code3}$; the address decoding circuit 370 generates a first target address by decoding the temperature signal $T_{code3}$; and the control logic circuit 340 reads the sub-mapping table "3" based on the first target address to determine the target refresh period $R_3$ for the first memory cell. Here, the first sub-mapping table is the sub-mapping table "3", the first target address is the physical address of the sub-mapping table "3", and the first target refresh period is the target refresh period $R_3$.

Figure 9:
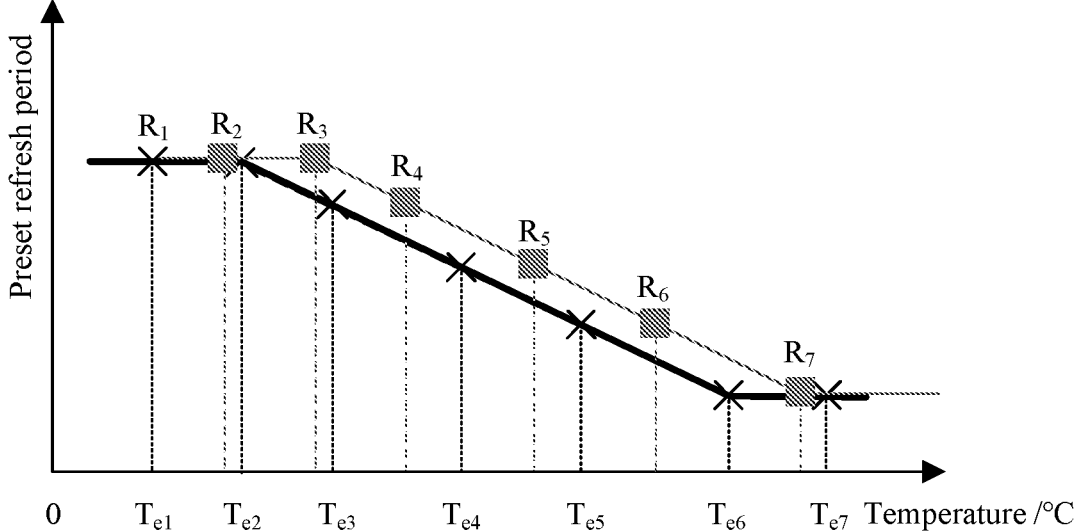
FIG. 9 is another schematic diagram of a refresh period vs. a temperature illustrated according to an implementation of the present disclosure.

Illustratively, as shown in Table 1 above and FIG. 9, when the temperature sensing circuit 330 senses that the temperature of the memory 300 is 40° C., it outputs a temperature signal $T_{code3}$; the address decoding circuit 370 generates a first target address by decoding the temperature signal $T_{code3}$; and the control logic circuit 340 reads the sub-mapping table "4" based on the shifted first target address to determine the target refresh period $R_4$ for the second memory cell, wherein $R_4 < R_3$. Here, the second sub-mapping table is the sub-mapping table "4", the shifted first target address is the physical address of the sub-mapping table "4", and the second target refresh period is the target refresh period $R_4$.

It is to be noted that the second sub-mapping table may be acquired by shifting the target address in the implementation of the present disclosure, and in other implementations, the second sub-mapping table may be acquired by shifting the temperature signal. For example, the second target address distinct from the first target address is generated by decoding the shifted temperature signal, and the second target address is configured to indicate the physical address of the second sub-mapping table.

In implementations of the present disclosure, the second sub-mapping table different from the first sub-mapping table may be acquired by shifting the first target address, and the second target refresh period is determined based on the second sub-mapping table. Thus, different refresh periods may be set for memory cells with different data retention characteristics to avoid data loss of the second memory cell with poorer data retention characteristics due to increased temperature, thereby facilitating further guaranteeing the reliability of data.

In some implementations, the first memory cell and the second memory cell are located in the same memory cell row; and the refresh control circuit 350 is, for example, configured to adjust the refresh period of the memory cell row to the second target refresh period.

The memory cell array 320 includes a plurality of memory cell rows each including a plurality of memory cells 321 and coupled with one word line 322. The refresh operation of the memory 300 is often executed row by row, therefore when the first memory cell and the second memory cell are located in the same memory cell row, the refresh period may be adjusted to the second target refresh period, thereby avoiding data loss of the first memory cell and the second memory cell.

In some implementations, the first memory cell and the second memory cell are located in different memory cell rows; and the refresh control circuit 350 is, for example, configured to adjust the refresh period of the memory cell row corresponding to the first memory cell to the first target refresh period, and adjust the refresh period of the memory cell row corresponding to the second memory cell to the second target refresh period.

It is appreciated that in implementations of the present disclosure, when the first memory cell and the second memory cell are located in different memory cell rows, refresh periods may be adjusted for different memory cell rows, respectively. That is, the refresh period of the memory cell row corresponding to the first memory cell is adjusted to the first target refresh period, and the refresh period of the memory cell row corresponding to the second memory cell is adjusted to the second target refresh period, which can reduce the power consumption and increase the useful life of the memory while guaranteeing that data in the first memory cell and the second memory cell is not lost.

In some implementations, the peripheral circuit 310 further includes: an address shifting circuit 380 configured to generate a second target address by shifting the first target address, wherein the second target address is configured to indicate the physical address of the second sub-mapping table of the plurality of sub-mapping tables; and the control logic circuit 340 is, for example, configured to acquire the second sub-mapping table based on the second target address to determine the second target refresh period.

Illustratively, when the temperature sensing circuit 330 senses that the temperature of the memory 300 is 40° C., it outputs a temperature signal $T_{code3}$; the address decoding circuit 370 generates a first target address by decoding the temperature signal $T_{code3}$; the address shifting circuit 380 generates the second target address by shifting the first target address; and the control logic circuit 340 reads the sub-mapping table "4" based on the second target address to determine the target refresh period $R_4$ of the second memory cell, wherein $R_4 < R_3$.

In some implementations, it is possible to perform an address shifting operation for a specific temperature window. For example, the temperature window is $T_{e2}$ to $T_{e6}$.

Illustratively, referring to FIG. 8, when the temperature is lower than or equal to $T_{e2}$, the preset refresh period may be set as a fixed value $R_2$, avoiding data loss and also having a lower power consumption; when the temperature is higher than $T_{e2}$ and lower than or equal to $T_{e6}$, 4 preset refresh periods $R_3$, $R_4$, $R_5$, and $R_6$ may be set for 4 temperature sections; and when the temperature is higher than $T_{e6}$ and lower than or equal to $T_{e7}$, the preset refresh period may be set as a fixed value $R_7$, avoiding data loss due to a too high temperature. As can be seen, in a temperature window $T_{e2}$ to $T_{e6}$, the data retention characteristics of the memory cells change dramatically with the temperature. Therefore, the address shifting operation may be performed for the specific temperature window $T_{e2}$ to $T_{e6}$.

Illustratively, when the temperature sensor senses a temperature higher than $T_{e2}$ and lower than or equal to $T_{e6}$, the address shifting circuit 380 may generate the second target address by shifting the first target address, and the control logic circuit 340 determines the first target refresh period and the second target refresh period based on the first target address and the second target address respectively to accommodate data retention characteristics of different memory cells.

Illustratively, when the temperature sensor senses a temperature lower than or equal to $T_{e2}$ or higher than $T_{e6}$, the control logic circuit 340 determines the first target refresh period based on the first target address.

In implementations of the present disclosure, by providing the address shifting circuit 380, it is possible to generate the second target address by shifting the first target address generated by decoding the temperature signal, and to determine the second target refresh period based on the second target address. Thus, for memory cells with different data retention characteristics, it is not necessary to modify the mapping table or newly add additional mapping tables (for example, designing different mapping tables for memory cells with different data retention characteristics), and it is possible to implement refresh period adjustment by a simple circuit design.

In some implementations, at the first temperature, there is a first difference between the first target refresh period and the second target refresh period; and at the second temperature, there is a second difference between the first target refresh period and the second target refresh period, wherein the second temperature is different from the first temperature, and the second difference is different from the first difference.

At different temperatures, the differences between data retention times of the first memory cell and the second memory cell may be different. For example, at a lower temperature, the difference between data retention times of the first memory cell and the second memory cell is smaller; whereas at a higher temperature, the difference between data retention times of the first memory cell and the second memory cell is larger. Therefore, it is possible to set the different offset amounts of refresh periods based on different temperature settings.

Illustratively, when the temperature sensing circuit 330 senses that the temperature of the memory 300 is 40° C., the first target refresh period is determined to be $R_3$, the second target refresh period is determined to be $R_4$, and there is a first difference between the first target refresh period $R_3$ and the second target refresh period $R_4$; and when the temperature sensing circuit 330 senses that the temperature of the memory 300 is 60° C., the first target refresh period is determined to be $R_5$, the second target refresh period is determined to be $R_6$, and there is a second difference between the first target refresh period $R_5$ and the second target refresh period $R_6$, wherein the second difference is greater than the first difference.

In implementations of the present disclosure, by setting different offset amounts of refresh periods for different temperatures, it is possible to reasonably set refresh periods based on the difference between data retention characteristics of different memory cells under different temperatures, which facilitates further reducing the power consumption and increasing the useful life of the memory 300.

Figure 10:
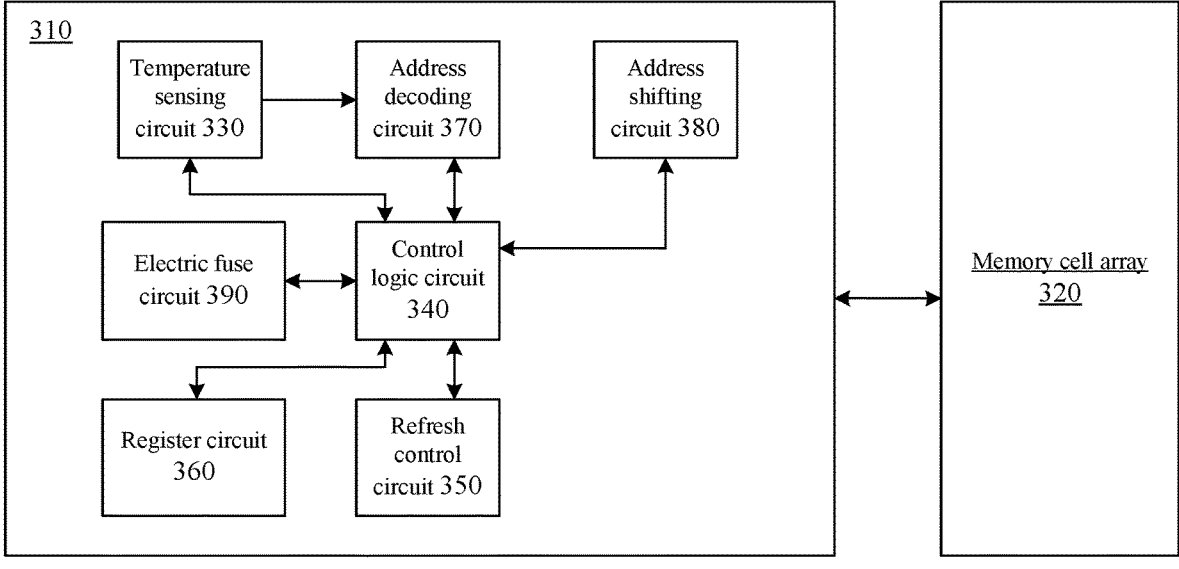
FIG. 10 is a schematic diagram of another memory illustrated according to an implementation of the present disclosure.

FIG. 10 is a schematic diagram of another memory 300 illustrated according to an implementation of the present disclosure. The memory cell array 320, the temperature sensing circuit 330, the control logic circuit 340, the refresh control circuit 350, the register circuit 360, the address decoding circuit 370 and the address shifting circuit 380 in FIG. 10 are similar to those in the above-described implementation and will not be described in detail any more. The peripheral circuit 310 in FIG. 10 further includes an electric fuse circuit 390 configured to store the mapping table; and the control logic circuit 340 is, for example, configured to read the mapping table in the electric fuse circuit 390 and store the read mapping table into the register circuit 360.

The electric fuse circuit 390 is configured to store the mapping table, and includes a programmable logic device such as an one time programmable (OTP) register, a few-time programmable (FTP) register or a multi-time programmable (MTP) register, etc. The OTP includes a fuse OTP or an anti-fuse OTP. Before the memory 300 leaves the factory, the mapping table may be written to the electric fuse circuit 390. Since the OTP, FTP, MTP, etc. are nonvolatile, the mapping table may be retained when the memory 300 is powered off, thereby avoiding loss of the mapping table.

The control logic circuit 340 may read the mapping table in the electric fuse circuit 390 first, and then buffer the read mapping table to the register circuit 360 such that the target refresh period may be determined based on the temperature signal output by the temperature sensing circuit 330 and the mapping table buffered in the register circuit 360 upon a temperature change such as an increase or decrease of the temperature, and the refresh period of the refresh signal may be adjusted to the target refresh period in time.

In the implementation of the present disclosure, by providing the electric fuse circuit to store the mapping table, since the electric fuse circuit is nonvolatile, the mapping table may be retained when the memory is powered off, thereby avoiding loss of the mapping table.

In some implementations, the memory 300 is further configured to update the preset refresh period corresponding to at least one preset temperature signal in the mapping table after the memory 300 is used for a time greater than or equal to a preset duration, wherein the updated preset refresh period is smaller than the preset refresh period corresponding to the at least one preset temperature signal before the updating.

As compared to just leaving the factory, after the memory 300 is used for a period of time, the performance of the memory 300 may degrade. For example, the data retention time of memory cells might decrease under at least one temperature. Therefore, the preset refresh period corresponding to at least one preset temperature signal may be adjusted to a smaller value after the memory 300 is used for a time greater than or equal to a preset duration. Illustratively, the preset refresh period corresponding to the preset temperature signal $T_{code3}$ in the sub-mapping table "3" is $R_3$, and after the memory is used for a period of time, the preset refresh period corresponding to the preset temperature signal $T_{code3}$ in the sub-mapping table "3" may be adjusted to $R_3'$, wherein $R_3'$ is smaller than $R_3$. The preset duration includes one month, half a year, a year, or a longer time. It is to be noted that after the memory 300 is used for a time greater than or equal to a preset duration, the preset refresh periods corresponding to one or more preset temperature signals in the mapping table may be updated, which is not particularly limited in the present disclosure.

In implementations of the present disclosure, the preset refresh period corresponding to at least one preset temperature signal in the mapping table is updated after the memory is used for a time greater than or equal to a preset duration, and the updated preset refresh period is smaller than the preset refresh period corresponding to the at least one preset temperature signal before the updating. Thus, the preset refresh period corresponding to the preset temperature signal may be adjusted in time according to the use time of the memory, which may further avoid data loss and increase the useful life of the memory.

Based on the aforementioned memory, an implementation of the present disclosure further provides an operating method for the memory.

FIG. 11 is a flow diagram of an operating method of a memory illustrated according to an implementation of the present disclosure. Referring to FIG. 11, the operating method includes at least the following operations: operation S410: sensing a temperature of the memory and generating a temperature signal based on the sensed temperature; operation S420: determining a target refresh period based on the temperature signal and a mapping table, wherein the mapping table includes a plurality of preset temperature signals and a plurality of preset refresh periods in a one-to-one correspondence; and operation S430: adjusting the refresh period of a refresh signal to the target refresh period, wherein the refresh signal is configured to indicate performing a refresh operation on a memory cell array.

In some implementations, the mapping table includes a plurality of sub-mapping tables for recoding the correspondence relationship between the preset temperature signals and the preset refresh periods; and the above-described operation S420 includes: generating a first target address by decoding the temperature signal, wherein the first target address is configured to indicate a physical address of a first sub-mapping table of the plurality of sub-mapping tables; and acquiring the first sub-mapping table based on the first target address to determine the target refresh period.

In some implementations, the memory cell array includes a first memory cell and a second memory cell, wherein the second memory cell has a data retention time smaller than that of the first memory cell.

The above-described acquiring the first sub-mapping table based on the first target address to determine the target refresh period includes: acquiring the first sub-mapping table based on the first target address to determine a first target refresh period for the first memory cell.

The above-described operating method further includes: acquire the second sub-mapping table of the plurality of sub-mapping tables based on the shifted first target address to determine the second target refresh period for the second memory cell, wherein the second sub-mapping table is different from the first sub-mapping table and the second target refresh period is smaller than the first target refresh period.

In some implementations, the above-described acquiring the second sub-mapping table of the plurality of sub-mapping tables based on the shifted first target address to determine the second target refresh period for the second memory cell includes: generating a second target address by shifting the first target address, wherein the second target address is configured to indicate a physical address of the second sub-mapping table of the plurality of sub-mapping tables; and acquiring the second sub-mapping table based on the second target address to determine the second target refresh period.

In some implementations, at the first temperature, there is a first difference between the first target refresh period and the second target refresh period; and at the second temperature, there is a second difference between the first target refresh period and the second target refresh period, wherein the second temperature is different from the first temperature, and the second difference is different from the first difference.

In some implementations, the first memory cell and the second memory cell are located in the same memory cell row; and the above-described adjusting the refresh period of the refresh signal to the target refresh period includes: adjusting the refresh period of the memory cell row to the second target refresh period.

In some implementations, the first memory cell and the second memory cell are located in different memory cell rows; and the above-described adjusting the refresh period of the refresh signal to the target refresh period includes: adjusting the refresh period of the memory cell row corresponding to the first memory cell to the first target refresh period; and adjusting the refresh period of the memory cell row corresponding to the second memory cell to the second target refresh period.

In some implementations, the peripheral circuit includes an electric fuse circuit and a register circuit, and the electric fuse circuit is configured to store the mapping table. The above-described operating method further includes: reading the mapping table in the electric fuse circuit and storing the read mapping table into the register circuit.

In some implementations, the above-described operating method further includes: updating the preset refresh period corresponding to at least one preset temperature signal in the mapping table after the memory is used for a time greater than or equal to a preset duration, wherein the updated preset refresh period is smaller than the preset refresh period corresponding to the at least one preset temperature signal before the updating.

The above-described operating method has been described in detail above with respect to the memory, and will not be described in detail any more for brevity.

Figure 12:
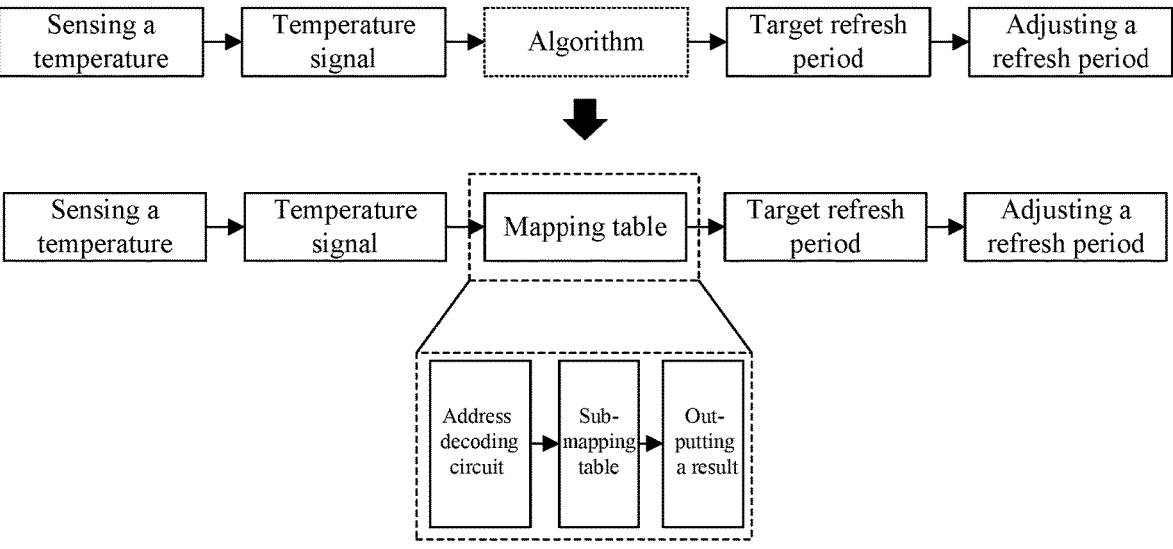
FIG. 12 is a schematic diagram of adjusting a refresh period illustrated according to an implementation of the present disclosure.

FIG. 12 is a schematic diagram of adjusting a refresh period illustrated according to an implementation of the present disclosure. Referring to FIG. 12, the temperature sensing circuit senses a temperature of the memory and generates a temperature signal based on the sensed temperature; the control logic circuit receives the temperature signal and determines a target refresh period based on the temperature signal and a mapping table; and the refresh control circuit adjusts a refresh period of a refresh signal to the target refresh period. Here, the mapping table is configured to store a result of a computer algorithm that may be developed in parallel with the circuit design of memory and written into a chip after the chip test. Of course, in other circuit designs and chip test processes, the algorithm may be optimized according to the circuit designs and test results.

In an example implementation, referring to FIG. 12, the address decoding circuit receives a temperature signal and decode the temperature signal to generate a target address; and the control logic circuit reads the first sub-mapping table in the register circuit based on the target address, and outputs a result that is configured to indicate the target refresh period.

Figure 13:
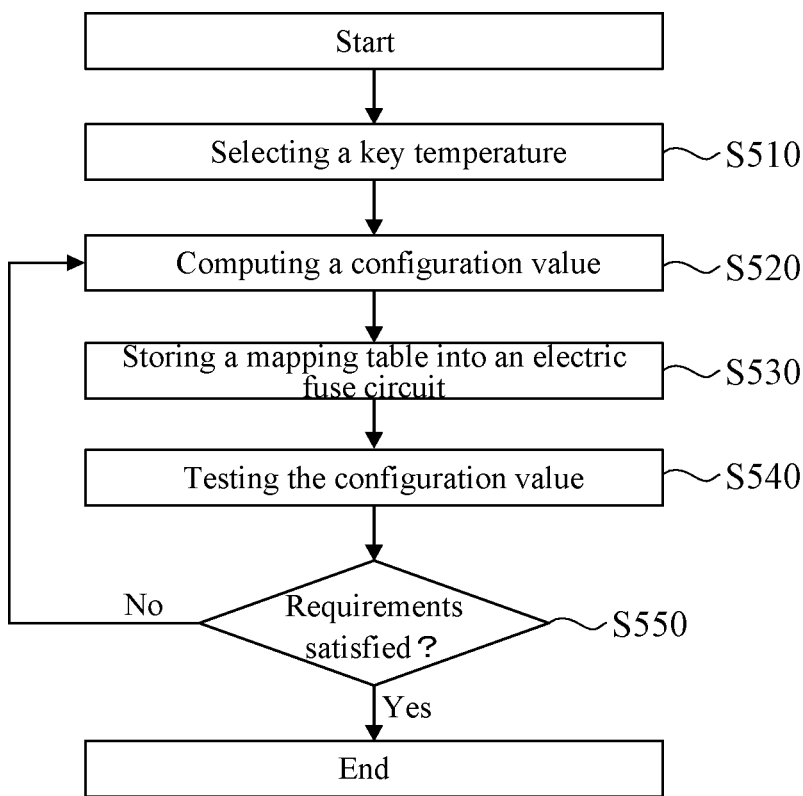
FIG. 13 is a schematic flow diagram of generating a mapping table by an algorithm illustrated according to an implementation of the present disclosure.

FIG. 13 is a schematic flow diagram of generating a mapping table by an algorithm illustrated according to an implementation of the present disclosure. The process of generating the mapping table in the implementation of the present disclosure will be described below with respect to FIG. 13 and the above-described implementations.

Operation S510 is executed to select a key temperature. At least one key temperature is selected in an operating temperature range of the memory. For example, the operating temperature range of the memory is 20° C.≤T≤80° C., and 7 key temperatures may be selected: 25° C., 35° C., 45° C., 50° C., 60° C., 70° C. and 80° C.

Operation S520 is executed to compute configuration values. Refresh periods (i.e., the configuration values) corresponding to the above-described 7 key temperatures are computed and the correspondence relationship between the 7 key temperatures and the 7 configuration values, namely the mapping table is established.

Operation S530 is executed to store the mapping table into the electric fuse circuit. For example, the data in the mapping table is stored to the electric fuse circuit by programming.

Operation S540 is executed to test the configuration values. For example, a test temperature is provided to test the memory.

Operation S550 is executed to determine whether the configuration values satisfy requirements based on the test results, wherein the process ends if so; and the process returns to operation S520 if not, in which the configuration values are recomputed by adjusting the algorithm, and the recomputed configuration values are stored into the electric fuse circuit until the requirements are satisfied. Here, under a test temperature, when the configuration value corresponding to the test temperature is used as the refresh period, it may be determined that the configuration value satisfies the requirements if it is sufficient for the memory to hold data.

Figure 14:
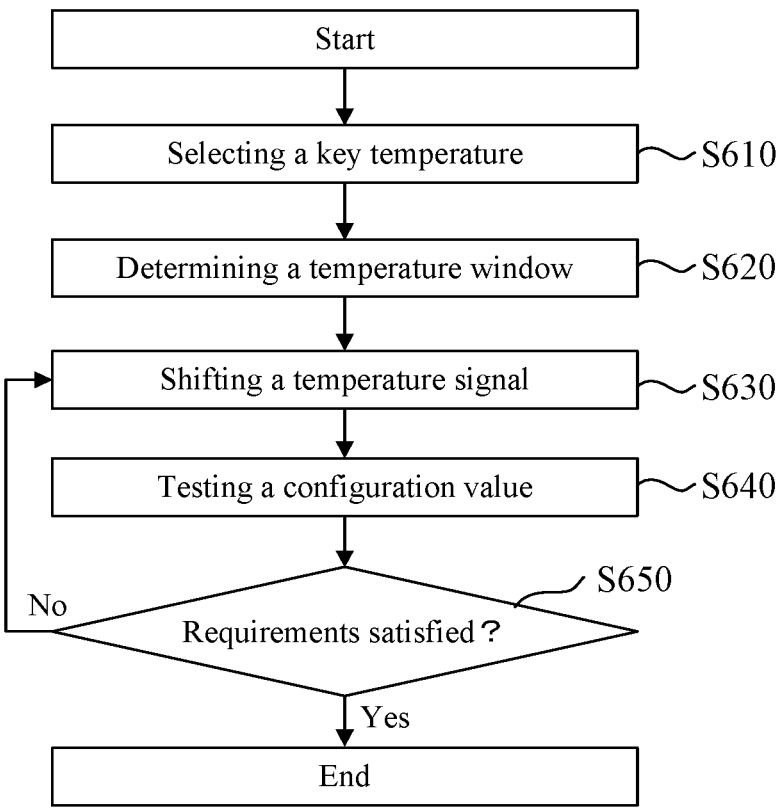
FIG. 14 is a schematic flow diagram of adjusting a temperature window illustrated according to an implementation of the present disclosure.

FIG. 14 is a schematic flow diagram of adjusting a temperature window illustrated according to an implementation of the present disclosure. The process of adjusting the temperature window in the implementation of the present disclosure will be described below with respect to FIG. 14 and the above-described implementations.

Operation S610 is executed to select a key temperature. At least one key temperature is selected in an operating temperature range of the memory. For example, the operating temperature range of the memory is 20° C.≤T≤80° C., and 7 key temperatures may be selected: 25° C., 35° C., 45° C., 50° C., 60° C., 70° C. and 80° C.

Operation S620 is executed to determine a temperature window. For example, when the temperature is higher than 40° C. and lower than or equal to 70° C., the refresh period changes with the temperature, and 40° C. to 70° C. may be used as the temperature window.

Operation S630 is executed to shift the temperature signal. For example, once the above-described temperature window does not satisfy requirements, the minimum threshold of the temperature window needs to be switched from 40° C. to 35° C. by only shifting the temperature by −5° C. such that at the actual temperature 40° C., the temperature signal is that corresponding to 35° C., and then the configuration value is read according to the shifted temperature signal.

Operation S640 is executed to test the configuration values. For example, a test temperature is provided to test the memory.

Operation S650 is executed to determine whether the configuration values satisfy requirements based on the test results, wherein the process ends if so; and the process returns to operation S630 if not, in which the temperature signal is re-shifted by adjusting the algorithm, and the configuration values corresponding to the new temperature window is stored into the electric fuse circuit until the requirements are satisfied. Here, under a test temperature, when the configuration value corresponding to the test temperature is used as the refresh period, it may be determined that the temperature window satisfies the requirements if it is sufficient for the memory to hold data.

An implementation of the present application further provides a memory system as shown in FIG. 1. The memory system 102 includes: one or more memories 300 as described in any one of the above-described implementations; and a memory controller 106 coupled to the memory 300 and configured to control the memory 300.

The memory 300 may correspond to the memory 104 in the implementation shown in FIG. 1, and the functions and applications of the memory 300 and the memory controller 106 as well as co-operations between the memory 300 and the memory controller 106 will not be described in detail any more herein.

An implementation of the present disclosure further provides an electronic device including the memory system according to the above-described implementation.

It should be understood that "one implementation" or "an implementation" as mentioned throughout the description means that particular features, structures, or characteristics related to the implementation are included in at least one implementation of the present disclosure. Therefore, reference to "in one implementation" or "in an implementation" throughout the description does not necessarily refer to the same implementation. In addition, these particular features, structures, or characteristics may be incorporated in one or more implementations in any suitable manners. It should be understood that in various implementations of the present disclosure, the sequence numbers of the above-described processes do not mean the sequential order of executions. The execution order of the processes should be determined by their functions and internal logics, and should not limit the implementation process of the implementations of the present disclosure. The sequence numbers of the above-described implementations of the present disclosure are only for the purpose of description rather than representing strengths and weaknesses of implementations.

It is to be noted that in the specification, terms "include", "comprise" or any other variants thereof are intended to encompass non-exclusive inclusion such that a process, method, article or device including a series of elements includes not only those elements, but also other elements that have not been listed explicitly, or further includes elements inherent to the process, method, article or device. Without any further limitations, an element defined by an expression "including a . . . " does not exclude additional identical elements in the process, method, article or device including said element.

What have been described above are only implementations of the present disclosure. However, the scope of the present invention is not limited thereto, and variations or substitutions that easily occur to those skilled in the art based upon the technical scope disclosed in the present disclosure should be encompassed in the scope of the present disclosure. Therefore, the scope of the present disclosure should be determined by the scope of the claims.

What is claimed is:

1. A memory, comprising a memory cell array and a peripheral circuit coupled with the memory cell array, wherein the peripheral circuit comprises:
a temperature sensing circuit configured to sense a temperature of the memory and generate a temperature signal based on the sensed temperature;
a control logic circuit configured to determine a target refresh period based on the temperature signal and a mapping table, wherein the mapping table comprises a plurality of preset temperature signals and a plurality of preset refresh periods in a one-to-one correspondence; and
a refresh control circuit configured to adjust a refresh period of a refresh signal to the target refresh period, wherein the refresh signal is configured to indicate performing a refresh operation on the memory cell array,
wherein the peripheral circuit further comprises:
a register circuit configured to store the mapping table, wherein the mapping table comprises a plurality of sub-mapping tables for recoding a correspondence relationship between the preset temperature signals and the preset refresh periods; and
an address decoding circuit configured to generate a first target address by decoding the temperature signal, wherein the first target address is configured to indicate a physical address of a first sub-mapping table of the plurality of sub-mapping tables,
wherein the control logic circuit is configured to acquire the first sub-mapping table based on the first target address to determine the target refresh period,
wherein the memory cell array comprises a first memory cell and a second memory cell, wherein the second memory cell has a data retention time smaller than that of the first memory cell, and
wherein the control logic circuit is configured to:
acquire the first sub-mapping table based on the first target address to determine a first target refresh period for the first memory cell; and
acquire a second sub-mapping table of the plurality of sub-mapping tables based on the first target address to determine a second target refresh period for the second memory cell, wherein the second sub-mapping table is different from the first sub-mapping table, and the second target refresh period is smaller than the first target refresh period.

2. The memory of claim 1, wherein the peripheral circuit further comprises:
an address shifting circuit configured to generate a second target address by shifting the first target address, wherein the second target address is configured to indicate a physical address of the second sub-mapping table of the plurality of sub-mapping tables, and
the control logic circuit is configured to acquire the second sub-mapping table based on the second target address to determine the second target refresh period.

3. The memory of claim 1, wherein
at a first temperature, there is a first difference between the first target refresh period and the second target refresh period, and
at a second temperature, there is a second difference between the first target refresh period and the second target refresh period, wherein the second temperature is different from the first temperature, and the second difference is different from the first difference.

4. The memory of claim 1, wherein
the first memory cell and the second memory cell are located in a same memory cell row, and
the refresh control circuit is configured to adjust a refresh period of the memory cell row to the second target refresh period.

5. The memory of claim 1, wherein
the first memory cell and the second memory cell are located in different memory cell rows, and
the refresh control circuit is configured to:
adjust a refresh period of a memory cell row corresponding to the first memory cell to the first target refresh period; and
adjust a refresh period of a memory cell row corresponding to the second memory cell to the second target refresh period.

6. The memory of claim 1, wherein the peripheral circuit further comprises:
an electric fuse circuit configured to store the mapping table, and
the control logic circuit is configured to read the mapping table in the electric fuse circuit and store the read mapping table into the register circuit.

7. The memory of claim 1, wherein
the memory is further configured to update the preset refresh period corresponding to at least one preset temperature signal in the mapping table after the memory is used for a time greater than or equal to a preset duration, wherein the updated preset refresh period is smaller than the preset refresh period corresponding to the at least one preset temperature signal before the updating.

8. An operating method of a memory, the operating method comprises:

sensing a temperature of a memory and generating a temperature signal based on the sensed temperature, wherein the memory comprises a memory cell array and a peripheral circuit coupled with the memory cell array;

determining a target refresh period based on the temperature signal and a mapping table, wherein the mapping table comprises a plurality of preset temperature signals and a plurality of preset refresh periods in a one-to-one correspondence;

adjusting a refresh period of a refresh signal to the target refresh period, wherein the refresh signal is configured to indicate performing a refresh operation on the memory cell array; and updating a preset refresh period corresponding to at least one preset temperature signal in the mapping table after the memory is used for a time greater than or equal to a preset duration, wherein the updated preset refresh period is smaller than the preset refresh period corresponding to the at least one preset temperature signal before the updating.

9. The operating method of claim 8, wherein the mapping table comprises a plurality of sub-mapping tables for recoding a correspondence relationship between the preset temperature signals and the preset refresh periods; and the determining the target refresh period based on the temperature signal and the mapping table comprises:

generating a first target address by decoding the temperature signal, wherein the first target address is configured to indicate a physical address of a first sub-mapping table of the plurality of sub-mapping tables; and acquiring the first sub-mapping table based on the first target address to determine the target refresh period.

10. The operating method of claim 9, wherein the memory cell array comprises a first memory cell and a second memory cell, wherein the second memory cell has a data retention time smaller than that of the first memory cell; and the acquiring the first sub-mapping table based on the first target address to determine the target refresh period comprises:

acquiring the first sub-mapping table based on the first target address to determine a first target refresh period for the first memory cell; and the operating method further comprises:

acquiring a second sub-mapping table of the plurality of sub-mapping tables based on the first target address to determine a second target refresh period for the second memory cell, wherein the second sub-mapping table is different from the first sub-mapping table, and the second target refresh period is smaller than the first target refresh period.

11. The operating method of claim 10, wherein the acquiring the second sub-mapping table of the plurality of sub-mapping tables based on the first target address to determine the second target refresh period for the second memory cell comprises:

generating a second target address by shifting the first target address, wherein the second target address is configured to indicate a physical address of the second sub-mapping table of the plurality of sub-mapping tables; and acquiring the second sub-mapping table based on the second target address to determine the second target refresh period.

12. The operating method of claim 10, wherein at a first temperature, there is a first difference between the first target refresh period and the second target refresh period; and at a second temperature, there is a second difference between the first target refresh period and the second target refresh period, wherein the second temperature is different from the first temperature, and the second difference is different from the first difference.

13. The operating method of claim 10, wherein the first memory cell and the second memory cell are located in a same memory cell row, and the adjusting the refresh period of the refresh signal to the target refresh period comprises:

adjusting a refresh period of the memory cell row to the second target refresh period.

14. The operating method of claim 10, wherein the first memory cell and the second memory cell are located in different memory cell rows, and the adjusting the refresh period of the refresh signal to the target refresh period comprises:

adjusting a refresh period of a memory cell row corresponding to the first memory cell to the first target refresh period; and adjusting a refresh period of a memory cell row corresponding to the second memory cell to the second target refresh period.

15. The operating method of claim 8, wherein the peripheral circuit comprises an electric fuse circuit and a register circuit, and the electric fuse circuit is configured to store the mapping table, and the operating method further comprises:

reading the mapping table in the electric fuse circuit and storing the read mapping table into the register circuit.

16. A memory system, comprising:

one or more memories, each of the one or more memories comprising a memory cell array and a peripheral circuit coupled with the memory cell array, wherein the peripheral circuit comprises:

a temperature sensing circuit configured to sense a temperature of the memory and generate a temperature signal based on the sensed temperature;

a control logic circuit configured to determine a target refresh period based on the temperature signal and a mapping table, wherein the mapping table comprises a plurality of preset temperature signals and a plurality of preset refresh periods in a one-to-one correspondence; and a refresh control circuit configured to adjust a refresh period of a refresh signal to the target refresh period, wherein the refresh signal is configured to indicate performing a refresh operation on the memory cell array; and a memory controller coupled to the memory and configured to control the memory, wherein the peripheral circuit further comprises:

a register circuit configured to store the mapping table, wherein the mapping table comprises a plurality of sub-mapping tables for recoding a correspondence relationship between the preset temperature signals and the preset refresh periods; and an address decoding circuit configured to generate a first target address by decoding the temperature signal, wherein the first target address is configured to indicate a physical address of a first sub-mapping table of the plurality of sub-mapping tables, wherein the control logic circuit is configured to acquire the first sub-mapping table based on the first target address to determine the target refresh period, and wherein the peripheral circuit further comprises:

an electric fuse circuit configured to store the mapping table, wherein the control logic circuit is configured to read the mapping table in the electric fuse circuit and store the read mapping table into the register circuit.

17. The memory system of claim 16, wherein the memory cell array comprises a first memory cell and a second memory cell, wherein the second memory cell has a data retention time smaller than that of the first memory cell, and wherein the control logic circuit is configured to:

acquire the first sub-mapping table based on the first target address to determine a first target refresh period for the first memory cell; and acquire a second sub-mapping table of the plurality of sub-mapping tables based on the first target address to determine a second target refresh period for the second memory cell, wherein the second sub-mapping table is different from the first sub-mapping table, and the second target refresh period is smaller than the first target refresh period.

18. The memory system of claim 17, wherein the peripheral circuit further comprises:

an address shifting circuit configured to generate a second target address by shifting the first target address, wherein the second target address is configured to indicate a physical address of the second sub-mapping table of the plurality of sub-mapping tables, and wherein the control logic circuit is configured to acquire the second sub-mapping table based on the second target address to determine the second target refresh period.

19. The memory system of claim 17, wherein:

at a first temperature, there is a first difference between the first target refresh period and the second target refresh period, and at a second temperature, there is a second difference between the first target refresh period and the second target refresh period, wherein the second temperature is different from the first temperature, and the second difference is different from the first difference.

20. The memory system of claim 17, wherein the refresh control circuit is configured to:

if the first memory cell and the second memory cell are located in a same memory cell row, adjust a refresh period of the memory cell row to the second target refresh period, and if the first memory cell and the second memory cell are located in different memory cell rows, adjust a refresh period of a memory cell row corresponding to the first memory cell to the first target refresh period, and adjust a refresh period of a memory cell row corresponding to the second memory cell to the second target refresh period.

\* \* \* \* \*